United States Patent
Wen et al.

(10) Patent No.: US 7,963,671 B2
(45) Date of Patent: Jun. 21, 2011

(54) LED MODULE AND LIGHT MODULATOR WITH THE SAME

(75) Inventors: Wen-Fu Wen, Taipei Hsien (TW); Kai Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 276 days.

(21) Appl. No.: 12/346,790

(22) Filed: Dec. 30, 2008

(65) Prior Publication Data

US 2010/0039817 A1    Feb. 18, 2010

(30) Foreign Application Priority Data

Aug. 14, 2008  (CN) .......................... 2008 1 0303760

(51) Int. Cl.
*F21S 4/00*    (2006.01)
*F21V 29/00*   (2006.01)

(52) U.S. Cl. ............ 362/249.02; 362/218; 362/294; 362/373; 362/631; 362/646

(58) Field of Classification Search .......... 362/218, 362/294, 373, 547, 631, 646, 249.02
See application file for complete search history.

(56) References Cited

U.S. PATENT DOCUMENTS

| | | | | |
|---|---|---|---|---|
| 4,473,870 | A | * | 9/1984 | Sorenson ..................... 362/647 |
| 5,640,792 | A | * | 6/1997 | Smith et al. .................. 40/546 |
| 7,766,527 | B2 | * | 8/2010 | Gingrich, III ............... 362/555 |
| 7,794,114 | B2 | * | 9/2010 | Medendorp, Jr. ............ 362/294 |

FOREIGN PATENT DOCUMENTS

| | | |
|---|---|---|
| CN | 2634503 Y | 8/2004 |
| CN | 1979333 A | 6/2007 |
| CN | 101207110 A | 6/2008 |

* cited by examiner

*Primary Examiner* — Stephen F Husar
*Assistant Examiner* — James W Cranson
(74) *Attorney, Agent, or Firm* — Zhigang Ma

(57) ABSTRACT

A light emitting diode (LED) module includes a driving circuit board, at least one LED, a thermal dispersing sheet and a heat sink. The driving circuit board includes a front surface and an opposite back surface. The at least one LED is mounted on the front surface of the driving circuit board and electrically connected to it. The thermal dispersing sheet is attached on the back surface. The heat sink is mounted on the driving circuit board in contacting the thermal dispersing sheet.

10 Claims, 3 Drawing Sheets

LED MODULE AND LIGHT MODULATOR WITH THE SAME

BACKGROUND

1. Technical Field

The present disclosure generally relates to light emitting diode (LED) modules and, particularly, to an LED module that can be repaired or replaced easily.

2. Description of the Related Art

In general, LEDs are widely used in illuminating devices. Particularly, in recent years, there has been an increasing demand for development of low power-consuming, high-power LEDs. Because such LEDs have several advantages, such as a long lifespan, less power consumption, environmental friendliness, compactness, and so on, they are widely used in projectors. In generally, both the LEDs and the driving circuits supplying power for those LEDs employed in a projector are often directly attached on a light engine of the projector forming an integrated structure which is too sophisticated to be detached. As a result, the LEDs employed in the projectors are difficult to be repaired or replaced. In addition, the engine supporting those LEDs is likely to be damaged during repairing or replacing those LEDs.

Therefore, it is desired to design a LED module and a light modulator with the same to overcome the above described problems.

DETAILED DESCRIPTION OF THE EMBODIMENTS

Figure 1:
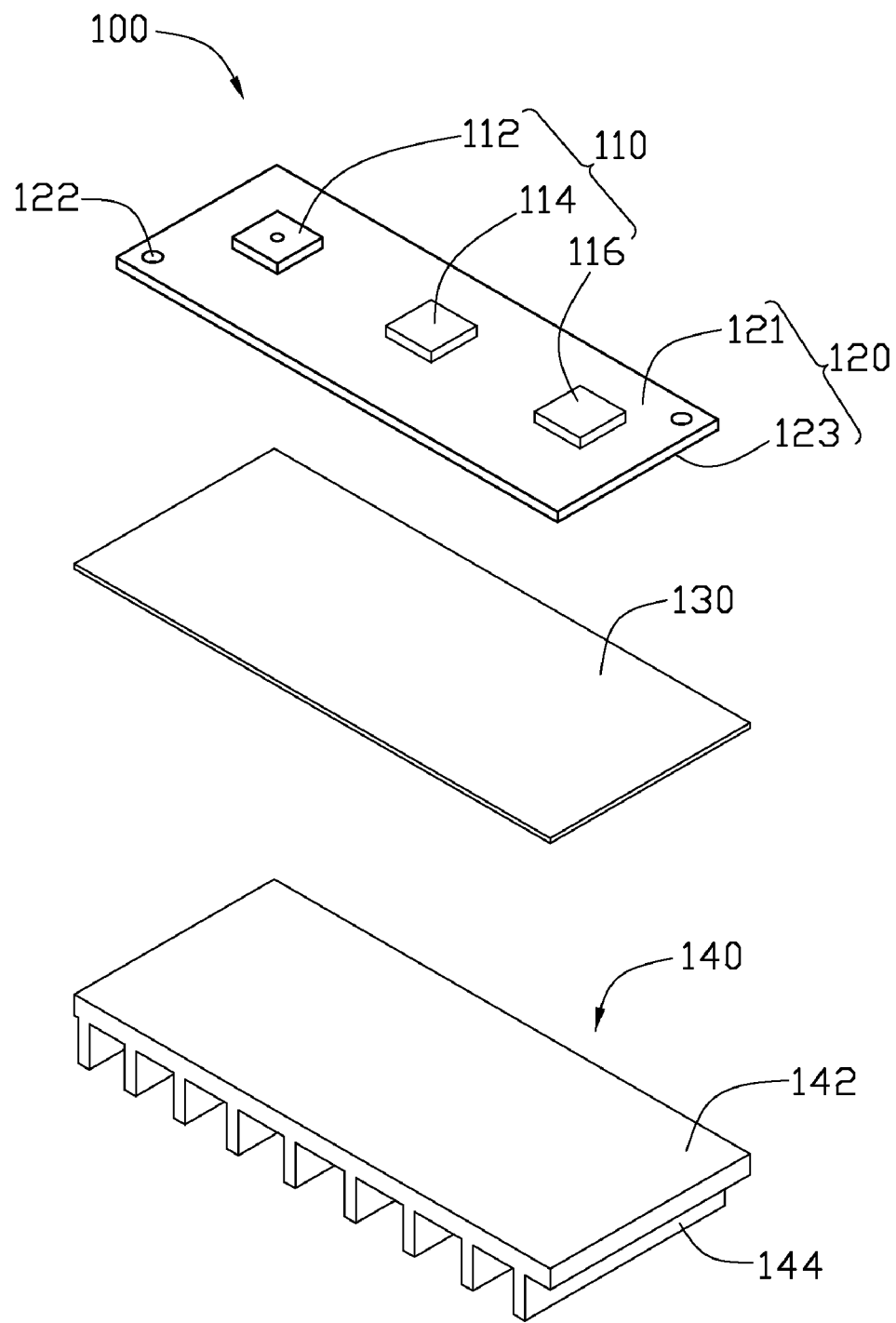
FIG. 1 is an isometric, exploded view of a light emitting diode (LED) module according to an exemplary embodiment.
Figure 2:
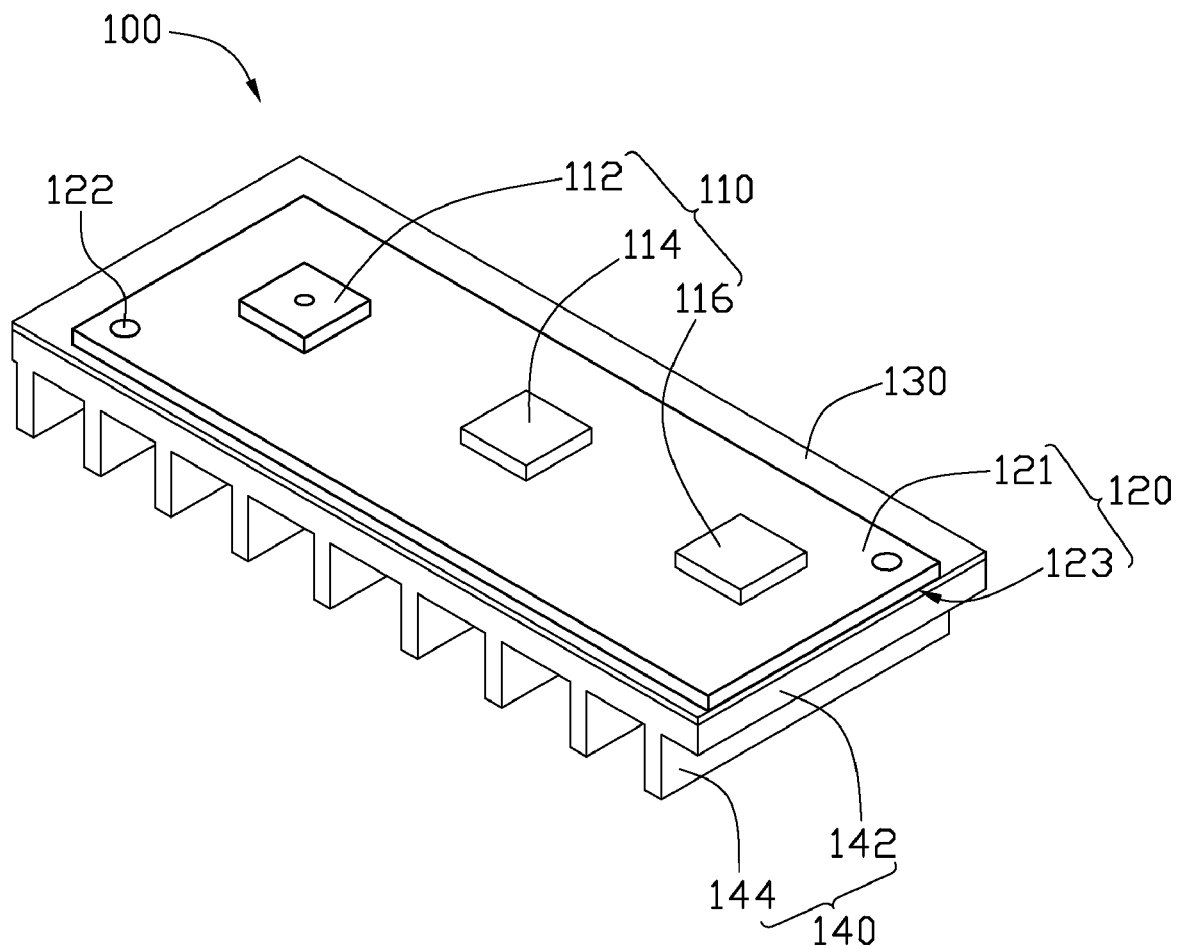
FIG. 2 is an isometric, assembled view of the LED module of FIG. 1.

Referring to FIGS. 1 and 2, a light emitting diode (LED) module 100 includes three LEDs 110, a driving circuit board 120, a thermal dispersing sheet 130, and a heat sink 140.

Each of the LEDs 110 may be a high-power LED producing a large amount of heat when illuminating. Generally, the LEDs may be formed by attaching chips to a housing having a reflective film and wire-bonding the chips to electric terminals installed on the housing. However, the configuration of each LED is not limited to above described example. To make sure the projector using the LED module 100 has panchromatic light for forming a full-color display, three LEDs, a red LED 112, a blue LED 114, and a green LED 126, are employed and separately mounted on the driving circuit board 120 and electrically connected to it.

The driving circuit board 120 includes a front surface 121, on which the LEDs 110 are mounted, an opposite back surface 123 and a number of electrical patterns (not shown) formed on the front surface 121 thereof for supplying the respective LEDs 110 with power. The driving circuit board 120 is a metal PCB or the like, with excellent mechanical strength. The driving circuit board 120 is quadrate shaped, and at least a pair of locating holes 122 are defined along a diagonal line of the driving circuit board 120 for accurately and precisely positioned the LED module 100 in a projector. Alternatively, the holes 122 of the driving board can be replaced by other locating structures such as poles.

The thermal dispersing sheet 130 is attached on the back surface 123 of the driving circuit board 120. The dispersing sheet 130 is made of a material having a high thermal transmission coefficient, such as aluminum, copper, copper alloy, thermally conductive grease, and the like.

The heat sink 140 is attached on the driving circuit board 120 in contact with the dispersing sheet 130 to disperse heat of the LEDs 110. The heat sink 140 includes a flat base 142 and an array of fin-like protrusions 144 distributed on a surface of the flat base 142 facing away from the dispersing sheet 130 to increase the heat sink's surface area for increasing the heat dissipation rate.

In this embodiment, the LEDs 110, the driving circuit board 120, the dispersing sheet 130, and the heat sink 140 are aggregated as a independent LED module 100 from a light engine of a projector. This way, it is easy to repair or replace the LED module 100 and its LEDs 110.

Figure 3:
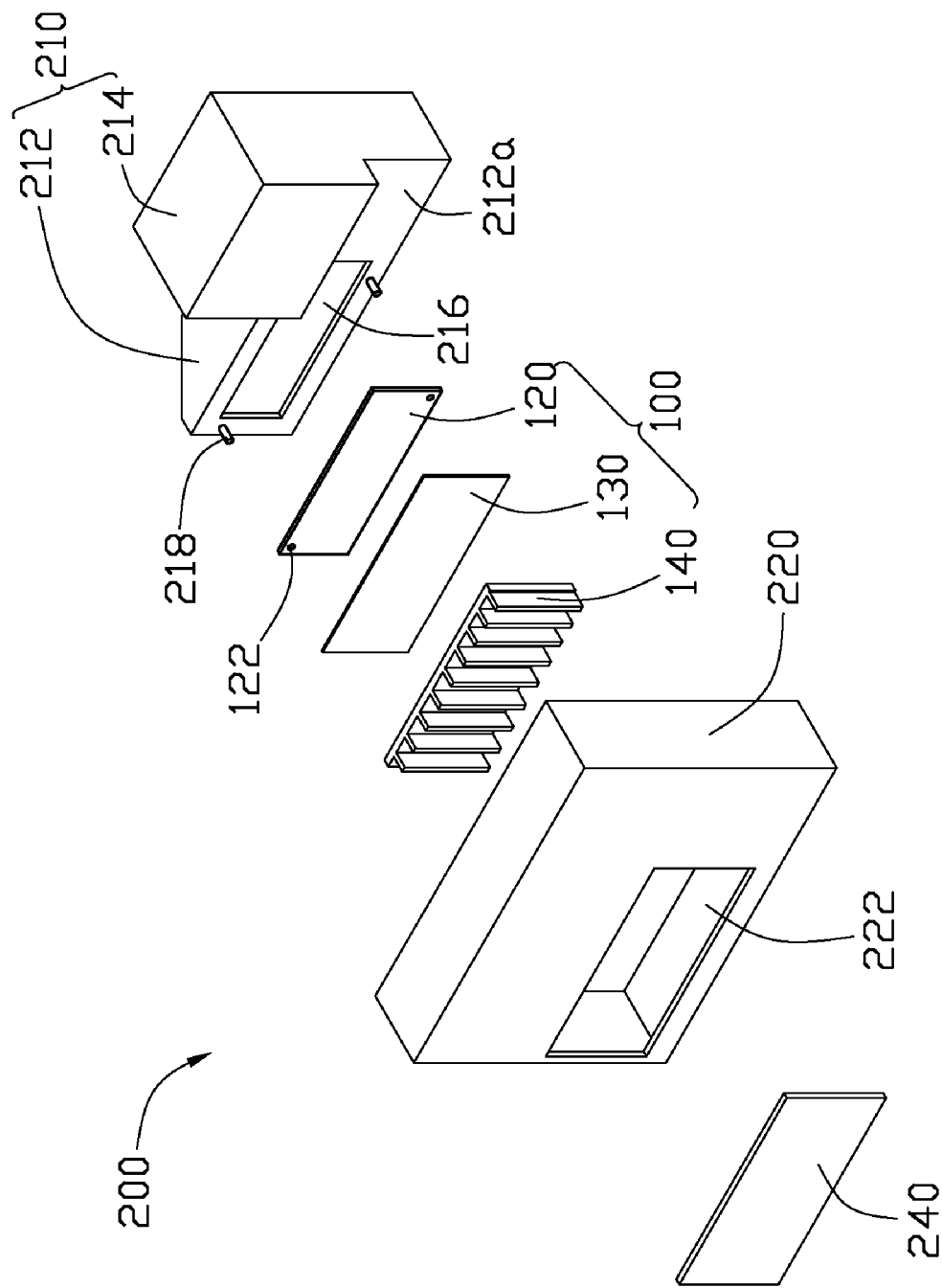
FIG. 3 is an isometric, exploded view of a light modulator with the LED module of FIG. 1 according to an exemplary embodiment.

Referring to FIG. 3, a light modulator 200 using the LED module 100 is shown. The light modulator 200 includes a light engine 210, a case 220, and the LED module 100.

The light engine 210 is received and fixed in the case 220, and is configured for modulating light emitted from the LED module 100. The light engine 210 includes a light input portion 212 and a light output portion 214 perpendicularly connected on an end of the light input portion 212. An opening 216 is defined in the under side 212a of the light input portion 212 for accommodating the LED module 100 and receiving light from the LED module 100. Adjacent to the opening 216, two locating poles 218 are formed on the light input portion 212 for being respectively inserted into corresponding locating holes 122 of the driving circuit board 120 to fix and locate the LED module 100 on the light engine 210. Instead of the locating poles 218 of the light engine 210, a number of holes can be defined in the light input portion 210 to engage or match with a number of poles as the locating structure of the driving circuit board 120.

The case 220 is configured for receiving the light engine 210 and the LED module 100 installed on the light engine 210. An access opening 222 is defined in the case 220 corresponding to the LED module 100 and is bigger than the LED module 100 for exposing the LED module to users for convenient replacement or repair of the LED module 100 and its LEDs 110 therethrough.

In addition, the light modulator 200 further includes a cover 240 attached on the case 220 and covering/sealing the access opening 222 for protecting the light engine 210 and the LED module 100 from contaminants.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A light modulator comprising:
a light engine comprising a light input portion and a light output portion perpendicularly connected on an end of the light input portion, the light input portion defining an opening and comprising a fixing structure;
a light emitting diode (LED) module mounted on the light input portion for emitting lights thereinto via the opening, the light emitting diode module comprising:
a driving circuit board comprising a front surface, an opposite back surface, and a locating structure for matching with the fixing structure to locate and fix the driving circuit board on the light input portion;

at least one LED mounted on the front surface of the driving circuit board and electrically connected to the driving circuit board;

a thermal dispersing sheet attached on the back surface; and a heat sink mounted on the driving circuit board in contact with the thermal dispersing sheet; and a case receiving the light engine and the LED module.

2. The light modulator as claimed in claim 1, wherein the locating structure is a pair of locating holes; the driving circuit board is quadrate shaped and the holes are defined along a digonal line of the driving circuit board; the fixing structure is a pair of locating poles formed on the light input portion of the light engine and inserted in the corresponding locating holes.

3. The light modulator as claimed in claim 1, wherein the locating structure is a pair of poles; the driving circuit board is quadrate shaped and the poles are formed along a digonal line of the driving circuit, the fixing structure is a pair of holes formed on the light input portion of the light engine and receiving the corresponding locating holes therein.

4. The light modulator as claimed in claim 1, wherein the at least one LED comprises a red LED, a blue LED, and a green LED, separately mounted on the driving circuit board.

5. The light modulator as claimed in claim 1, wherein the thermal dispersing sheet is made of a material having a high thermal transmission coefficient.

6. The light modulator as claimed in claim 1, wherein the thermal dispersing sheet is made of a material selected from the group consisting of aluminum, copper, and copper alloy.

7. The light modulator as claimed in claim 1, wherein the thermal dispersing sheet is made of thermally conductive grease.

8. The light modulator as claimed in claim 1, wherein the heat sink includes a flat base and an array of fin-like protrusions distributed on the base facing away from the driving circuit board.

9. The light modulator as claimed in claim 1, wherein an access opening is defined in the case corresponding to the LED module and is bigger than the LED module.

10. The light modulator as claimed in claim 9, further comprising a cover attached on the case for sealing the access opening of the case.

* * * * *